US011610862B2

(12) United States Patent
Collins et al.

(10) Patent No.: US 11,610,862 B2
(45) Date of Patent: Mar. 21, 2023

(54) SEMICONDUCTOR PACKAGES WITH CHIPLETS COUPLED TO A MEMORY DEVICE

(71) Applicant: Intel Corporation, Santa Clara, CA (US)

(72) Inventors: Andrew Collins, Chandler, AZ (US); Jianyong Xie, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1027 days.

(21) Appl. No.: 16/147,560

(22) Filed: Sep. 28, 2018

(65) Prior Publication Data

US 2020/0105718 A1 Apr. 2, 2020

(51) Int. Cl.
*H01L 25/065* (2006.01)
*H01L 23/00* (2006.01)
*H01L 23/528* (2006.01)

(52) U.S. Cl.
CPC ........ *H01L 25/0655* (2013.01); *H01L 23/528* (2013.01); *H01L 24/17* (2013.01); *H01L 2924/15311* (2013.01)

(58) Field of Classification Search
CPC ... H01L 45/085; H01L 45/12; H01L 45/1253; H01L 23/538; H01L 23/5389; H01L 23/49827; H01L 23/5384; H01L 2224/08165; H01L 2224/16165; H01L 2224/16235; H01L 2224/32165; H01L 2224/32235; H01L 2224/40165; H01L 2224/40235; H01L 2224/48165; H01L 2224/48235; H01L 2224/24155; H01L 2224/24225; H01L 2224/24227; H01L 2225/06548; H01L 2225/065; H01L 2225/06596; H01L 2225/1005; H01L 2225/1094; H01L 2225/06506; H01L 2225/06551; H01L 2225/1041; H01L 2225/107; H01L 25/065; H01L 25/0657; H01L 25/105; H01L 25/16; H01L 25/167; H01L 25/18; H01L 25/042; H01L 25/0655; H01L 25/072; H01L 25/0753; H01L 25/115; H01L 2924/1434; H01L 45/14; H01L 45/145; H01L 45/1691; G11C 11/5614; G11C 13/0011; H05K 2201/01; H05K 2201/0195; H05K 2201/065;

(Continued)

(56) References Cited

U.S. PATENT DOCUMENTS 10,535,608 B1 * 1/2020 Rubin ............... H01L 23/12
2012/0005396 A1 * 1/2012 Sargeant ........... G06F 13/1684
710/316

(Continued)

*Primary Examiner* — Victor A Mandala
*Assistant Examiner* — Lawrence C Tynes, Jr.
(74) *Attorney, Agent, or Firm* — Schwabe, Williamson & Wyatt, P.C.

(57) ABSTRACT

Apparatuses, devices and systems associated with semiconductor packages with chiplet and memory device coupling are disclosed herein. In embodiments, a semiconductor package may include a first chiplet, a second chiplet, and a memory device. The semiconductor package may further include an interconnect structure that couples the first chiplet to a first memory channel of the memory device and the second chiplet to a second memory channel of the memory device. Other embodiments may be described and/or claimed.

24 Claims, 11 Drawing Sheets

(58) Field of Classification Search
CPC . H05K 2201/06596; H05K 2201/1005; H05K 2201/1094
See application file for complete search history.

(56) References Cited

U.S. PATENT DOCUMENTS

| | | | |
|---|---|---|---|
| 2012/0096322 A1* | 4/2012 | Huh | G06F 11/1008 714/719 |
| 2014/0332966 A1* | 11/2014 | Xiu | C09J 163/00 257/773 |
| 2019/0206798 A1* | 7/2019 | Collins | H01L 25/0655 |
| 2020/0035603 A1* | 1/2020 | Rubin | H01L 23/04 |
| 2020/0098692 A1* | 3/2020 | Lift | H01L 23/5386 |

\* cited by examiner

US 11,610,862 B2

SEMICONDUCTOR PACKAGES WITH CHIPLETS COUPLED TO A MEMORY DEVICE

TECHNICAL FIELD

The present disclosure relates to the field of electronic circuits. More particularly, the present disclosure relates to semiconductor packages with chiplet and memory device coupling.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

Legacy memory interconnect approaches have one active die communicating with one or more memory devices. For example, the active die size is paired with one or more memory dies. In particular, the active die size memory physical layer (PHY) input/output (I/O) width matches the width of the memory device I/O at a ratio of roughly 1 to 1.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
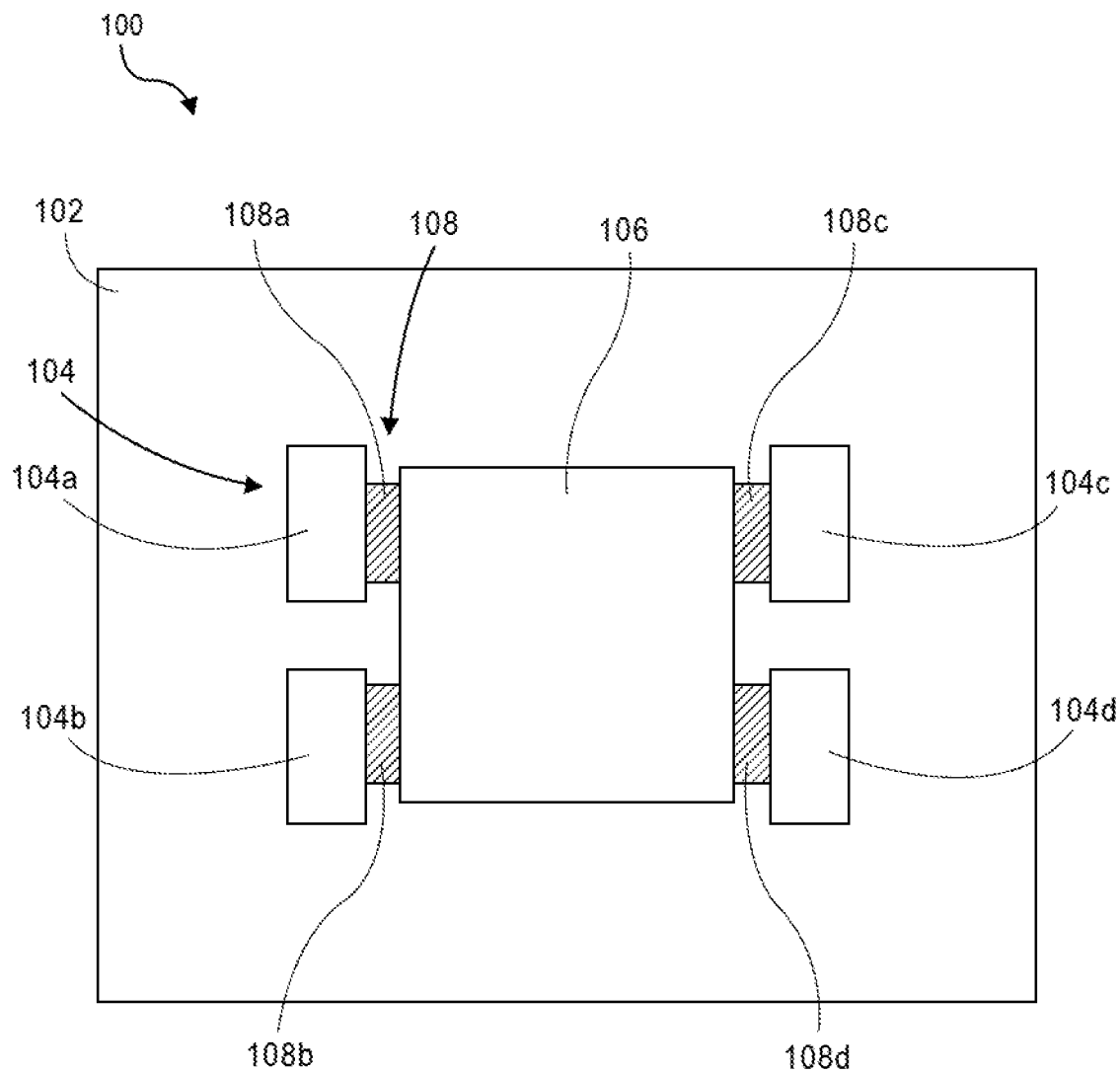
FIG. 1 illustrates a top view of an example semiconductor package, according to various embodiments.

Apparatuses, devices and systems associated with semiconductor packages with chiplet and memory device coupling are disclosed herein. In embodiments, a semiconductor package may include a first chiplet, a second chiplet, and a memory device. The semiconductor package may further include an interconnect structure that couples the first chiplet to a first memory channel of the memory device and the second chiplet to a second memory channel of the memory device.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates a top view of an example semiconductor package 100, according to various embodiments. In particular, FIG. 1 illustrates a simplified top view of the semiconductor package 100 to illustrate certain features.

The semiconductor package 100 includes a substrate assembly 102. The substrate assembly 102 includes a substrate with one or more layers located on the substrate. The layers can include dielectric material, conductive elements (such as traces, vias, and/or conductive planes), or some combination thereof.

The semiconductor package 100 further includes a plurality of chiplets 104. For example, the semiconductor package 100 includes a first chiplet 104a, a second chiplet 104b, a third chiplet 104c, and a fourth chiplet 104d in the illustrated embodiment. The chiplets 104 are mounted to a surface of the substrate assembly 102. Each of the chiplets 104 can comprise a miniscule circuit that may be coupled with other chiplets to produce an electronic component, such as a microprocessor and/or a chip. In some embodiments, each of the chiplets 104 may have an area of between 20 square millimeters (mm$^2$) and 400 mm$^2$. Utilizing chiplets may provide for more good dies per wafer, greater flexibility to bin based on performance/leakage, and greater flexibility to scale the die complex size (logic elements or cores) for different product applications than larger dies.

The semiconductor package 100 further includes a memory device 106. The memory device 106 is mounted to the same surface of the substrate assembly 102 as the chiplets 104. The memory device 106 may be a high bandwidth memory (HBM) device (such as an HBM dynamic random-access memory (DRAM) device, an HBM2 device, and/or an HBM3 device) in some embodiments. Further, the memory device 106 may be a high performance, high bandwidth memory device in some embodiments.

The memory device 106 includes a plurality of memory channels that support communication with the memory device 106. For example, each of the memory channels provide access to the memory device 106 for storage and retrieval of data from the memory device 106. In some embodiments, the memory channels may be grouped into channel clusters, where each channel cluster includes one or more of the memory channels. For example, the memory device 106 may include eight memory channels in some embodiments, where each of the channel clusters includes two memory channels or four memory channels. Each memory channel may have its own clock, the memory channels may share a clock, or some combination thereof.

The memory device 106 includes a PHY I/O. The PHY I/O can be a centralized PHY I/O or a distributed PHY I/O. For centralized PHY I/O, a single PHY I/O may be utilized by all the memory channels of the memory device 106. For distributed PHY I/O, the memory device 106 includes a plurality of PHY I/Os, where each of the PHY I/Os may be utilized by one or more of the memory channels. For example, a first and a second memory channel may utilize one of the distributed PHY I/Os, while a third and a fourth memory channel may utilize another of the distributed PHY I/Os. In some embodiments, the PHY I/O are separated into I/O quadrants, where the quadrants can match a floor plan of the memory device 106. In some embodiments, distributed PHY I/O may reduce the I/O power of the memory device 106, and achieve high bandwidth and high performance.

The semiconductor package 100 further includes an interconnect structure 108. The interconnect structure 108 couples the chiplets 104 to the memory device 106. In some embodiments, the interconnect structure 108 includes one or more embedded multi-die interconnect bridges (EMIBs), where each of the EMIBs are embedded within the substrate assembly 102. The substrate assembly 102 includes conductive elements that couple the chiplets 104 and the memory device 106 to the EMIBs. Each of the EMIBs include a piece of passive silicon with conductive elements located within the passive silicon for conducting signals. In other embodiments, the interconnect structure 108 may include active EMIBs with repeaters designed into the bridge, interposers (such as silicon interposers, organic interposers, or other interposers known in the art), fan out wafer level structures, or some combination thereof.

In the illustrated embodiment, the interconnect structure 108 includes a first EMIB 108a, a second EMIB 108b, a third EMIB 108c, and a fourth EMIB 108d. The first EMIB 108a couples the first chiplet 104a to the memory device 106, the second EMIB 108b couples the second chiplet 104b to the memory device 106, the third EMIB 108c couples the third chiplet 104c to the memory device 106, and the fourth EMIB 108d couples the fourth chiplet 104d to the memory device 106. Each of the EMIBs can couple each of the chiplets 104 to different channel clusters of the memory device 106, where each channel cluster includes one or more memory channels. For example, the first EMIB 108a can couple the first chiplet 104a to a first channel cluster, the second EMIB 108b can couple the second chiplet 104b to a second channel cluster, the third EMIB 108c can couple the third chiplet 104c to a third channel cluster, and the fourth EMIB 108d can couple the fourth chiplet 104d to a fourth channel cluster. Further, each of the EMIBs can couple each of the chiplets 104 to a centralized PHY I/O or to different distributed PHY I/Os. For example, the first EMIB 108a can couple the first chiplet 104a to a first distributed PHY I/O, the second EMIB 108b can couple the second chiplet 104b to a second distributed PHY I/O, the third EMIB 108c can couple the third chiplet 104c to a third distributed PHY I/O, and the fourth EMIB 108d can couple the fourth chiplet 104d to a fourth distributed PHY I/O.

While the illustrated embodiment shows four chiplets 104 and four EMIBs 108, it is to be understood that there may be more or fewer chiplets 104 and/or more or fewer EMIBs 108 in other embodiments. For example, the semiconductor package 100 can include four chiplets 104 and two EMIBs 108 in other embodiments, where a first of the EMIBs 108 couples two of the chiplets 104 to the memory device 106 and a second of the EMIBs 108 couples the other two of the chiplets 104 to the memory device 106. Further, the EMIBs 108 may couple two or more of the chiplets 104 together in some embodiments. The chiplets 104 coupled with each other via the EMIBs 108 may utilize the EMIBs 108 for communication between the chiplets 104, the communication including clock distribution communications, register control communications, interface testing function communications, or some combination thereof.

Figure 2:
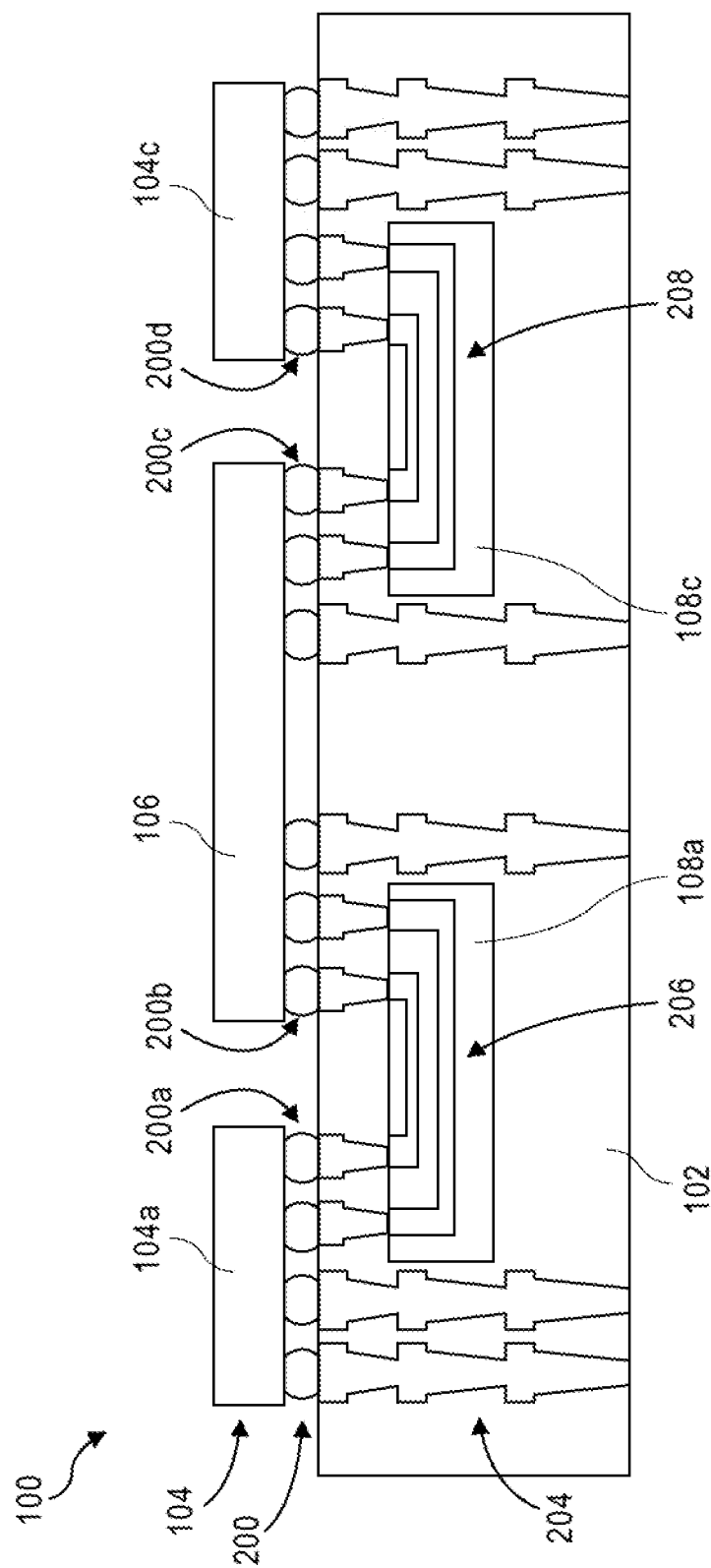
FIG. 2 illustrates a cross-sectional, side view of the example semiconductor package of FIG. 1, according to various embodiments.

FIG. 2 illustrates a cross-sectional, side view of the example semiconductor package 100 of FIG. 1, according to various embodiments. In particular, FIG. 2 illustrates the first chiplet 104a, the third chiplet 104c, and the memory device 106 mounted to the substrate assembly 102. Further, the first EMIB 108a and the third EMIB 108c are embedded within the substrate assembly 102.

The semiconductor package 100 further includes a plurality of interconnect elements 200. The interconnect elements 200 couple the first chiplet 104a, the third chiplet 104c, and the memory device 106 to conductive elements 204 of the substrate assembly 102. For example, the interconnect elements 200 couple the first chiplet 104a, the third chiplet 104c, and the memory device 106 to pads of the conductive elements 204, the pads located at a surface of the substrate assembly 102. In the illustrated embodiment, the interconnect elements 200 are illustrated as a ball grid array. In other embodiments, the interconnect elements 200 may be a ball grid array, a land grid array, a column grid array, or some combination thereof.

The conductive elements 204 couple some of the interconnect elements 200 to the first EMIB 108a and the third EMIB 108c. For example, the conductive elements 204 couple a first portion 200a of the interconnect elements 200 and a second portion 200b of the interconnect elements 200 to the first EMIBR 108a, where the first portion 200a is coupled to the first chiplet 104a and the second portion 200b is coupled to the memory device 106. Further, the conductive elements 204 couple a third portion 200c of the interconnect elements 200 and a fourth portion 200d of the interconnect elements 200 to the third EMIB 108c, where the third portion 200c is coupled to the memory device 106 and the fourth portion is coupled to the third chiplet 104c.

The first EMIB 108a includes one or more conductive paths 206 that couple a portion of the conductive elements 204 coupled to the first chiplet 104a with a portion of the conductive elements 204 coupled to the memory device 106. Accordingly, the first EMIB 108a provides for communication between the first chiplet 104a and the memory device 106 via the conductive paths 206. For example, the conductive paths 206 of the first EMIB 108a can provide for exchange of data between the first chiplet 104a and the memory device 106, the data for storage on the memory device 106 and/or being retrieved from the memory device 106.

The third EMIB 108c includes one or more conductive paths 208 that couple a portion of the conductive elements 204 coupled to the memory device 106 with a portion of the conductive elements 204 coupled to the third chiplet 104c. Accordingly, the third EMIB 108c provides for communication between the third chiplet 104c and the memory device 106 via the conductive paths 208. For example, the conductive paths 208 of the third EMIB 108c can provide for exchange of data between the first chiplet 104a and the memory device 106, the data for storage on the memory device 106 and/or being retrieved from the memory device 106.

Figure 3:
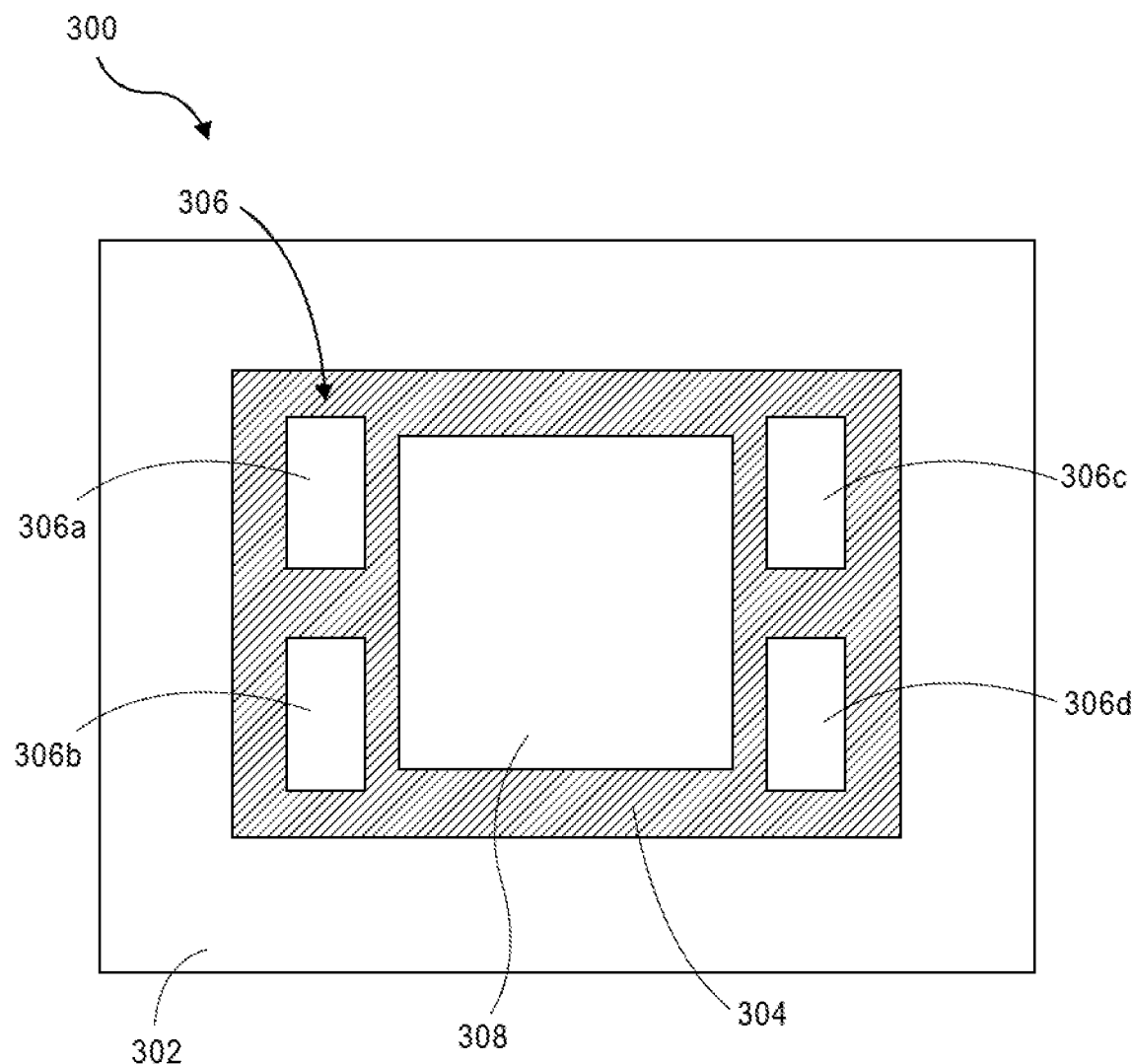
FIG. 3 illustrates a top view of another example semiconductor package, according to various embodiments.

FIG. 3 illustrates a top view of another example semiconductor package 300, according to various embodiments. In particular, FIG. 3 illustrates a simplified top view of the semiconductor package 300 to illustrate certain features.

The semiconductor package 300 includes a substrate assembly 302. The substrate assembly 302 includes one or more of the features of the substrate assembly 102 (FIG. 1). In particular, the substrate assembly 302 includes a substrate with one or more layers located on the substrate. The layers can include dielectric material, conductive elements (such as traces, vias, and/or conductive planes), or some combination thereof.

The semiconductor package 300 further includes an interconnect structure 304. In the illustrated embodiment, the interconnect structure 304 comprises an interposer. The interposer is mounted to a surface of the substrate assembly 302. The interposer can be passive or active silicon with one or more conductive paths located within the silicon. The conductive paths couple to some of the conductive elements of the substrate assembly 302 at a first side of the interposer and extend to a second side of the interposer. In some embodiments, some of the conductive paths may extend between pads located at the second side of the interposer.

The semiconductor package 300 further includes a plurality of chiplets 306. For example, the semiconductor package 300 includes a first chiplet 306a, a second chiplet 306b, a third chiplet 306c, and a fourth chiplet 306d. The plurality of chiplets 306 include one or more of the features of the plurality of chiplets 104 (FIG. 1). The plurality of chiplets 306 are mounted to the interconnect structure 304 on an opposite side of the interconnect structure 304 from the substrate assembly 302. Further, each of the plurality of chiplets 306 are coupled to one or more of the conductive paths of the interconnect structure 304.

The semiconductor package 300 further includes a memory device 308. The memory device 308 includes one or more of the features of the memory device 106 (FIG. 1). The memory device 308 is mounted to the interconnect structure 304 on an opposite side of the interconnect structure 304 from the substrate assembly 302. Further, the memory device 308 is coupled to one or more of the conductive paths of the interconnect structure 304.

The interconnect structure 304 couples each of the plurality of chiplets 306 to the memory device 308. In particular, the conductive pathways couple each of the plurality of chiplets 306 to the memory device 308 and provides for conduction of signals between each of the plurality of chiplets 306 and the memory device 308. The interconnect structure 304 can couple each of the plurality of chiplets to different channel clusters of the memory device 308, where each channel cluster includes one or more memory channels of the memory device 308. For example, the interconnect structure 304 can couple the first chiplet 306a to a first channel cluster, the second chiplet 306b to a second channel cluster, the third chiplet 306c to a third channel cluster, and the fourth chiplet 306d to a fourth channel cluster. Further, the interconnect structure 304 can couple each of the chiplets 306 to a centralized PHY I/O of the memory device 308 or to different distributed PHY I/Os of the memory device 308.

In some embodiments, the interconnect structure 304 can further couple one or more of the chiplets 306 to one or more of the other chiplets 306. For example, the interconnect structure 304 can couple the first chiplet 306a to the second chiplet 306b. The chiplets 306 coupled to each other via the interconnect structure 304 may utilize the interconnect structure 304 for communication between the chiplets 306, the communication including clock distribution communications, register control communications, interface testing function communications, or some combination thereof. While the illustrated embodiment shows four chiplets 306, it is to be understood that there may be more or fewer chiplets 306 in other embodiments.

Figure 4:
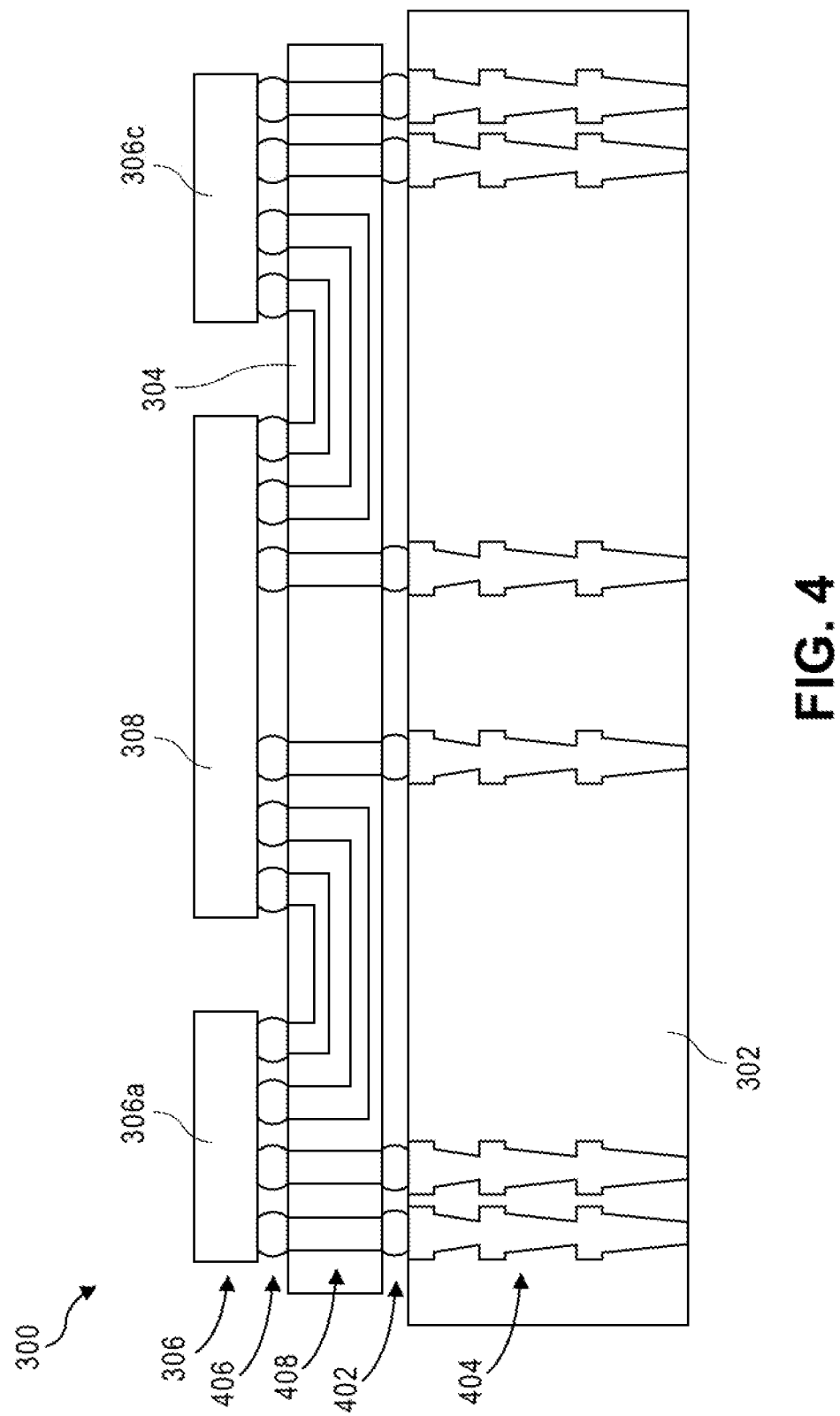
FIG. 4 illustrates a cross-sectional, side view of the example semiconductor package of FIG. 3, according to various embodiments.

FIG. 4 illustrates a cross-sectional, side view of the example semiconductor package 300 of FIG. 3, according to various embodiments. In particular, FIG. 4 illustrates the interconnect structure 304 mounted to the substrate assembly 302. Further, the first chiplet 306a, the third chiplet 306c, and the memory device 308 are mounted to the interconnect structure 304.

The semiconductor package 300 includes a first plurality of interconnect elements 402 that couple the interconnect structure 304 to conductive elements 404 (such as traces, vias, and/or conductive planes) of the substrate assembly 302. For example, the interconnect elements 402 couple the interconnect structure 304 to pads of the conductive elements 404. In the illustrated embodiment, the interconnect elements 402 are illustrated as a ball grid array. In other embodiments, the interconnect elements 402 may be a ball grid array, a land grid array, a column grid array, or some combination thereof.

The semiconductor package 300 further includes a second plurality of interconnect elements 406. The interconnect elements 406 couple the first chiplet 306a, the third chiplet 306c, and the memory device 308 to the interconnect structure 304. In the illustrated embodiment, the interconnect elements 406 are illustrated as a ball grid array. In other embodiments, the interconnect elements 406 may be a ball grid array, a land grid array, a column grid array, or some combination thereof.

The interconnect structure 304 includes one or more conductive paths 408. A portion of the conductive paths 408 can couple the substrate assembly 302 to the first chiplet 306a, the third chiplet 306c, and/or the memory device 308. Further, a portion of the conductive paths 408 can couple the first chiplet 306a to the memory device 308 and the third chiplet 306c to the memory device 308. Accordingly, the conductive paths 408 provide for communication among the substrate assembly 302, the first chiplet 306a, the third chiplet 306c, and the memory device 308. For example, the conductive paths 408 can provide for exchange of data between the first chiplet 306a and the memory device 308, and the third chiplet 306c and the memory device 308, the data for storage on the memory device 308 and/or being retrieved from the memory device 308.

In other embodiments, the conductive paths 408 may further couple one or more of the chiplets 306 together. For example, the conductive paths 408 may couple the first chiplet 306a and the third chiplet 306c. The conductive paths 408 may provide for communication between the chiplets 306, the communication including clock distribution communications, register control communications, interface testing function communications, or some combination thereof.

Figure 5:
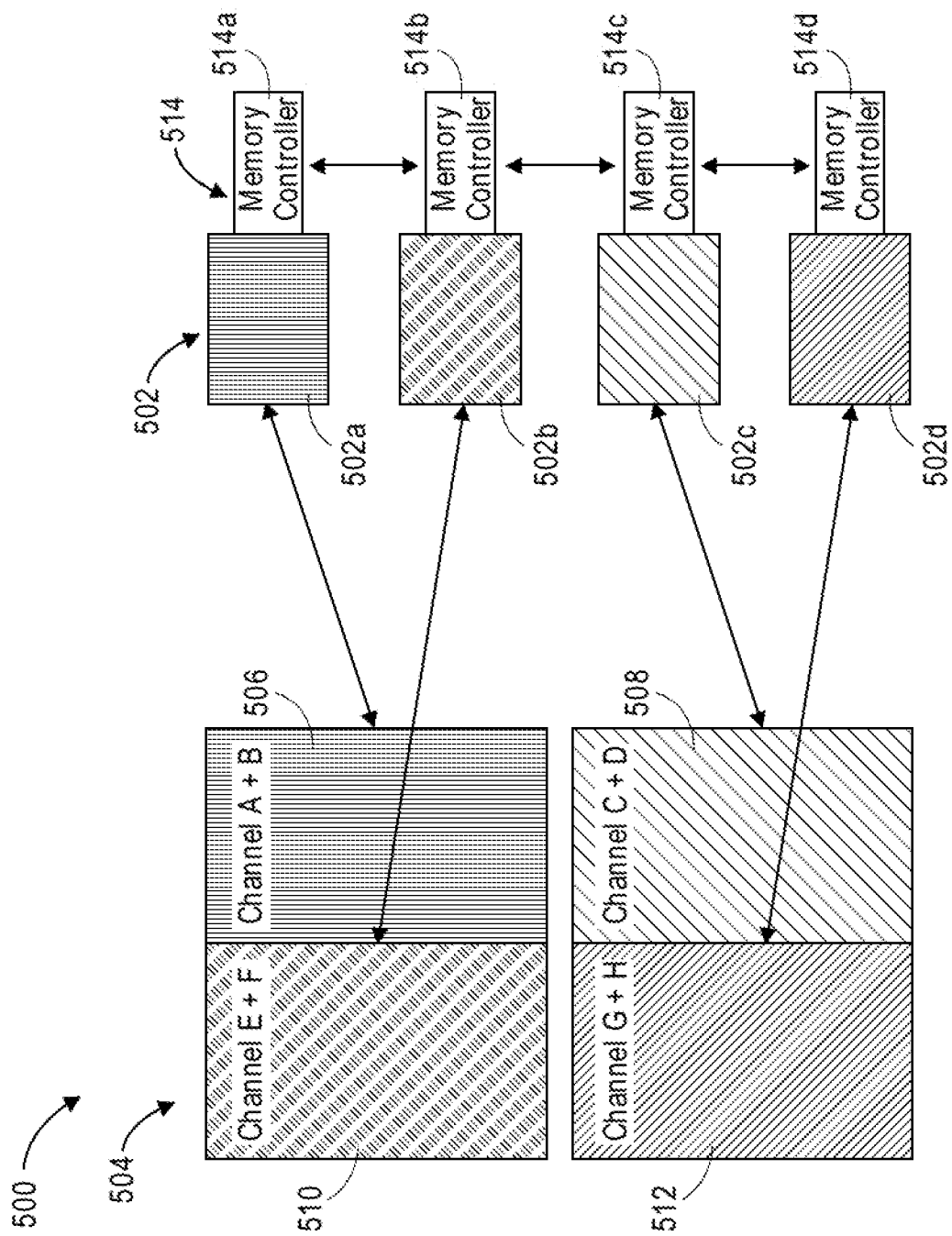
FIG. 5 illustrates a representation of an example semiconductor package arrangement, according to various embodiments.

FIG. 5 illustrates a representation 500 of an example semiconductor package arrangement, according to various embodiments. In particular, the representation 500 illustrates coupling among chiplets 502 and a memory device 504 in some embodiments. The chiplets 502 include one or more of the features of the chiplets 104 (FIG. 1) and/or the chiplets 306 (FIG. 3). Further, the memory device 504 includes one or more of the features of the memory device 106 (FIG. 1) and/or the memory device 308 (FIG. 3). The coupling may be implemented by an interconnect structure (such as the interconnect structure 108 (FIG. 1), the interconnect structure 304 (FIG. 3), and/or fan out wafer level structures), as is described further in relation to FIG. 5. The chiplets 502, the memory device 504, and the interconnect structure may be implemented within a semiconductor package, such as the semiconductor package 100 (FIG. 1) and/or the semiconductor package 300 (FIG. 3).

In the illustrated embodiment, the memory device 504 includes eight memory channels. The memory channels are clustered into four channel clusters: first channel cluster 506, second channel cluster 508, third channel cluster 510, and fourth channel cluster 512. Each channel cluster includes two memory channels. In particular, the first channel cluster 506 includes a first memory channel (which may be referred to as "Channel A") and a second memory channel (which may be referred to as "Channel B"). The second channel cluster 508 includes a third memory channel (which may be referred to as "Channel C") and a fourth memory channel (which may be referred to as "Channel D"). The third channel cluster 510 includes a fifth memory channel (which may be referred to as "Channel E") and a sixth memory channel (which may be referred to as "Channel F"). The fourth channel cluster 512 includes a seventh memory channel (which may be referred to as "Channel G") and an eighth memory channel (which may be referred to as "Channel H"). In other embodiments, the memory device 504 may have more or fewer memory channels, the memory device 504 may have more or fewer channel clusters, and/or the channel clusters may include different allocations of the memory channels.

The chiplets 502 include a first chiplet 502a, a second chiplet 502b, a third chiplet 502c, and a fourth chiplet 502d. The chiplets 502 may be included in a single die complex, may be included in separate die complexes, may not be included in a die complex, or some combination thereof. Each of the chiplets 502 are coupled to different ones of the channel clusters. In particular, the first chiplet 502a is coupled to the first channel cluster 506, the second chiplet 502b is coupled to the third channel cluster 510, the third chiplet 502c is coupled to the second channel cluster 508, and the fourth chiplet 502d is coupled to the fourth channel cluster 512. Each of the chiplets 502 can utilize the respective channel cluster to store data in and retrieve data from the memory device 504. Each of the chiplets 502 have a PHY I/O that is one-quarter of the PHY I/O of the memory device 504. For example, each of the PHY I/O of the chiplets 502 may be the same size of PHY I/O associated with each of the channel clusters. Further, the chiplets 502 may be coupled to each other. For example, the chiplets 502 may share clocking generation and control circuits. The chiplets 502 being coupled can allow for communication among the chiplets 502, including clock tree distribution communications, register control communications, interface testing function communications, or some combination thereof.

The representation 500 further includes a plurality of memory controllers 514. Each of the chiplets 502 has one of the memory controllers 514. In particular, the first chiplet 502a has a first memory controller 514a, the second chiplet 502b has a second memory controller 514b, the third chiplet 502c has a third memory controller 514c, and the fourth chiplet 502d has a fourth memory controller 514d. Each of the memory controllers 514 may facilitate communication of the corresponding chiplets 502 with the memory device 504. Further, the memory controllers 514 are coupled to each other. Accordingly, the memory controllers 514 can communicate among themselves, including register control communications, interface testing function communications, or some combination thereof. For example, the memory controllers 514 may implement interface testing functions (such as IEEE 1500). In other embodiments, the representation 500 may include a single memory controller that is coupled to all of the chiplets 502.

Figure 6:
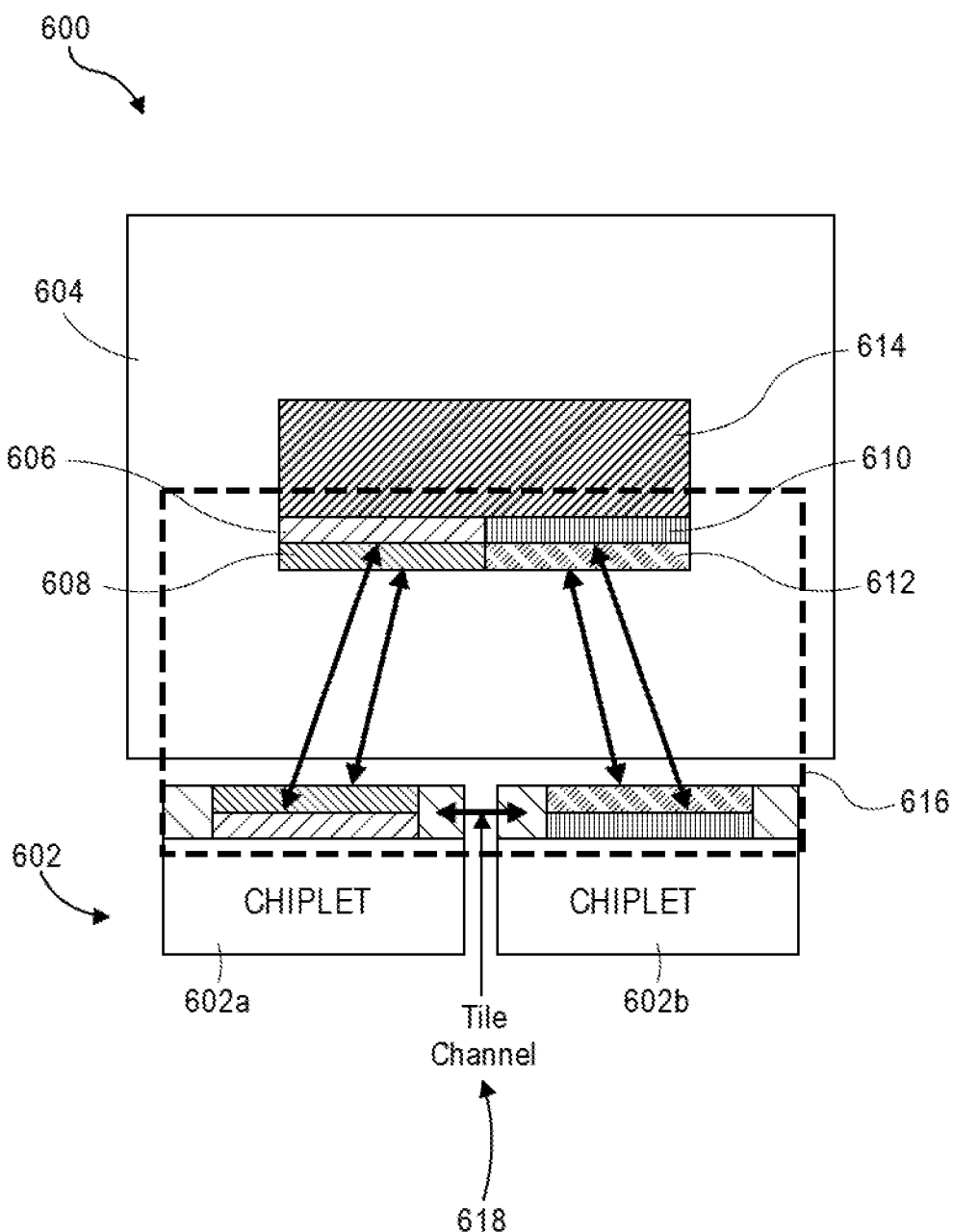
FIG. 6 illustrates a representation of another example semiconductor package arrangement, according to various embodiments.

FIG. 6 illustrates a representation 600 of another example semiconductor package arrangement, according to various embodiments. In particular, the representation 600 illustrates coupling among chiplets 602 and a memory device 604 in some embodiments. The chiplets 602 include one or more of the features of the chiplets 104 (FIG. 1) and/or the chiplets 306 (FIG. 3). Further, the memory device 604 includes one or more of the features of the memory device 106 (FIG. 1) and/or the memory device 308 (FIG. 3). The chiplets 602 and the memory device 604 may be implemented within a semiconductor package, such as the semiconductor package 100 (FIG. 1) and/or the semiconductor package 300 (FIG. 3).

In the illustrated embodiment, the memory device 604 includes four channel clusters: first channel cluster 606, second channel cluster 608, third channel cluster 610, and fourth channel cluster 612. Each of the channel clusters includes one or more memory channels of the memory device 604. In some embodiments, the memory device 604 may include eight memory channels, where each of the channel clusters includes two memory channels. In other embodiments, there may be more or fewer channel clusters, more or fewer memory channels, different allocations of memory channels among the channel clusters, or some combination thereof. Further, the memory device 604 includes a centralized PHY I/O 614. The centralized PHY I/O 614 can include the four channel clusters.

The chiplets 602 include a first chiplet 602a and a second chiplet 602b. The chiplets 602 may be included in a single die complex, may be included in separate die complexes, may not be included in a die complex, or some combination thereof. The first chiplet 602a is coupled to the first channel cluster 606 and the second channel cluster 608. The first chiplet 602a can utilize the first channel cluster 606 and/or the second channel cluster 608 to store data in and retrieve data from the memory device 604. The second chiplet 602b is coupled to the third channel cluster 610 and the fourth channel cluster 612. The second chiplet 602b can utilize the third channel cluster 610 and/or the fourth channel cluster 612 to store data in and retrieve data from the memory device 604. The first chiplet 602a and the second chiplet 602b are further coupled to each other. The first chiplet 602a and the second chiplet 602b can communicate with each other, including clock distribution communications, register control communications, interface testing function communications, or some combination thereof.

The representation 600 further includes an interconnect structure that provides the coupling among the first chiplet 602a, the second chiplet 602b, and the memory device 604. In particular, the interconnect structure is illustrated as an EMIB 616 in the illustrated embodiments. The EMIB 616 includes one or more of the features of the first EMIB 108a (FIG. 1), the second EMIB 108b (FIG. 1), the third EMIB 108c (FIG. 1), and/or the fourth EMIB 108d (FIG. 1). The EMIB 616 can provide the coupling between the first chiplet 602a and the memory device 604, the second chiplet 602b and the memory device 604, the first chiplet 602a and the second chiplet 602b, or some combination thereof. In other embodiments, the interconnect structure may be implemented as one or more EMIBs (such as the first EMIB 108a, the second EMIB 108b, the third EMIB 108c, and/or the fourth EMIB 108d (FIG. 1)), an interposer (such as the interposer described in relation to FIG. 3 and FIG. 4), fan out wafer level structures, or some combination thereof. A tile channel 618 may further be coupled to the first chiplet 602a and the second chiplet 602b in embodiments where the first chiplet 602a and the second chiplet 602b are tiled. In other embodiments, the tile channel 618 may be omitted.

Figure 7:
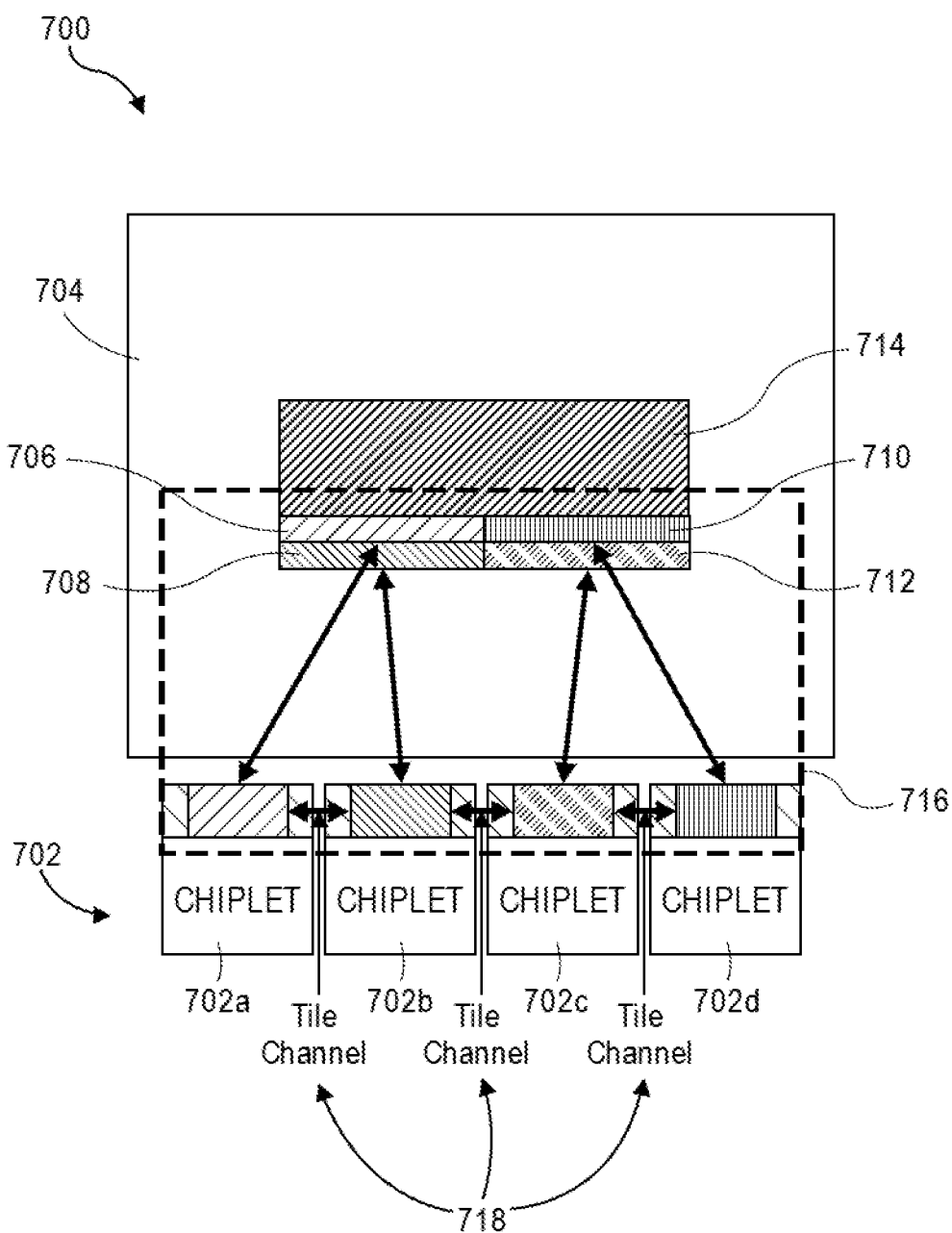
FIG. 7 illustrates a representation of another example semiconductor package arrangement, according to various embodiments.

FIG. 7 illustrates a representation 700 of another example semiconductor package arrangement, according to various embodiments. In particular, the representation 700 illustrates coupling among chiplets 702 and a memory device 704 in some embodiments. The chiplets 702 include one or more of the features of the chiplets 104 (FIG. 1) and/or the chiplets 306 (FIG. 3). Further, the memory device 704 includes one or more of the features of the memory device 106 (FIG. 1) and/or the memory device 308 (FIG. 3). The chiplets 702 and the memory device 704 may be implemented within a semiconductor package, such as the semiconductor package 100 (FIG. 1) and/or the semiconductor package 300 (FIG. 3).

In the illustrated embodiment, the memory device 704 includes four channel clusters: first channel cluster 706, second channel cluster 708, third channel cluster 710, and fourth channel cluster 712. Each of the channel clusters includes one or more memory channels of the memory device 704. In some embodiments, the memory device 704 may include eight memory channels, where each of the channel clusters includes two memory channels. In other embodiments, there may be more or fewer channel clusters, more or fewer memory channels, different allocations of memory channels among the channel clusters, or some combination thereof. Further, the memory device 704 includes a centralized PHY I/O 714. The centralized PHY I/O 714 can include the four channel clusters.

The chiplets 702 include a first chiplet 702a, a second chiplet 702b, a third chiplet 702c, and a fourth chiplet 702d. The chiplets 702 may be included in a single die complex, may be included in separate die complexes, may not be included in a die complex, or some combination thereof. Each of the chiplets 702 are coupled to different ones of the channel clusters. For example, the first chiplet 702a is coupled to the first channel cluster 706, the second chiplet 702b is coupled to the second channel cluster 708, the third chiplet 702c is coupled to the third channel cluster 710, and the fourth chiplet 702d is coupled to the fourth channel cluster 712. Each of the chiplets 702 can utilize the respective channel cluster to store data in and retrieve data from the memory device 704. The first chiplet 702a, the second chiplet 702b, the third chiplet 702c, and the fourth chiplet 702d are further coupled to each other. The first chiplet 702a, the second chiplet 702b, the third chiplet 702c, and the fourth chiplet 702d can communicate with each other, including clock distribution communications, register control communications, interface testing function communications, or some combination thereof.

The representation 700 further includes an interconnect structure that provides the coupling among the first chiplet 702a, the second chiplet 702b, the third chiplet 702c, the fourth chiplet 702d, and the memory device 704. In particular, the interconnect structure is illustrated as an EMIB 716 in the illustrated embodiments. The EMIB 716 includes one or more of the features of the first EMIB 108a (FIG. 1), the second EMIB 108b (FIG. 1), the third EMIB 108c (FIG. 1), and/or the fourth EMIB 108d (FIG. 1). The EMIB 716 can provide the coupling between the first chiplet 702a and the memory device 704, the second chiplet 702b and the memory device 704, the third chiplet 702c and the memory device 704, the fourth chiplet 702d and the memory device 704, the first chiplet 702a, the second chiplet 702b, the third chiplet 702c, and the fourth chiplet 702d, or some combination thereof. In other embodiments, the interconnect structure may be implemented as one or more EMIBs (such as the first EMIB 108a, the second EMIB 108b, the third EMIB 108c, and/or the fourth EMIB 108d (FIG. 1)), an interposer (such as the interposer described in relation to FIG. 3 and FIG. 4), fan out wafer level structures, or some combination thereof. One or more tile channels 718 may further be coupled to the first chiplet 702a, the second chiplet 702b, the third chiplet 702c, and the fourth chiplet 702d in embodiments where the first chiplet 702a, the second chiplet 702b, the third chiplet 702c, and the fourth chiplet 702d are tiled. In other embodiments, the tile channels 718 may be omitted.

Figure 8:
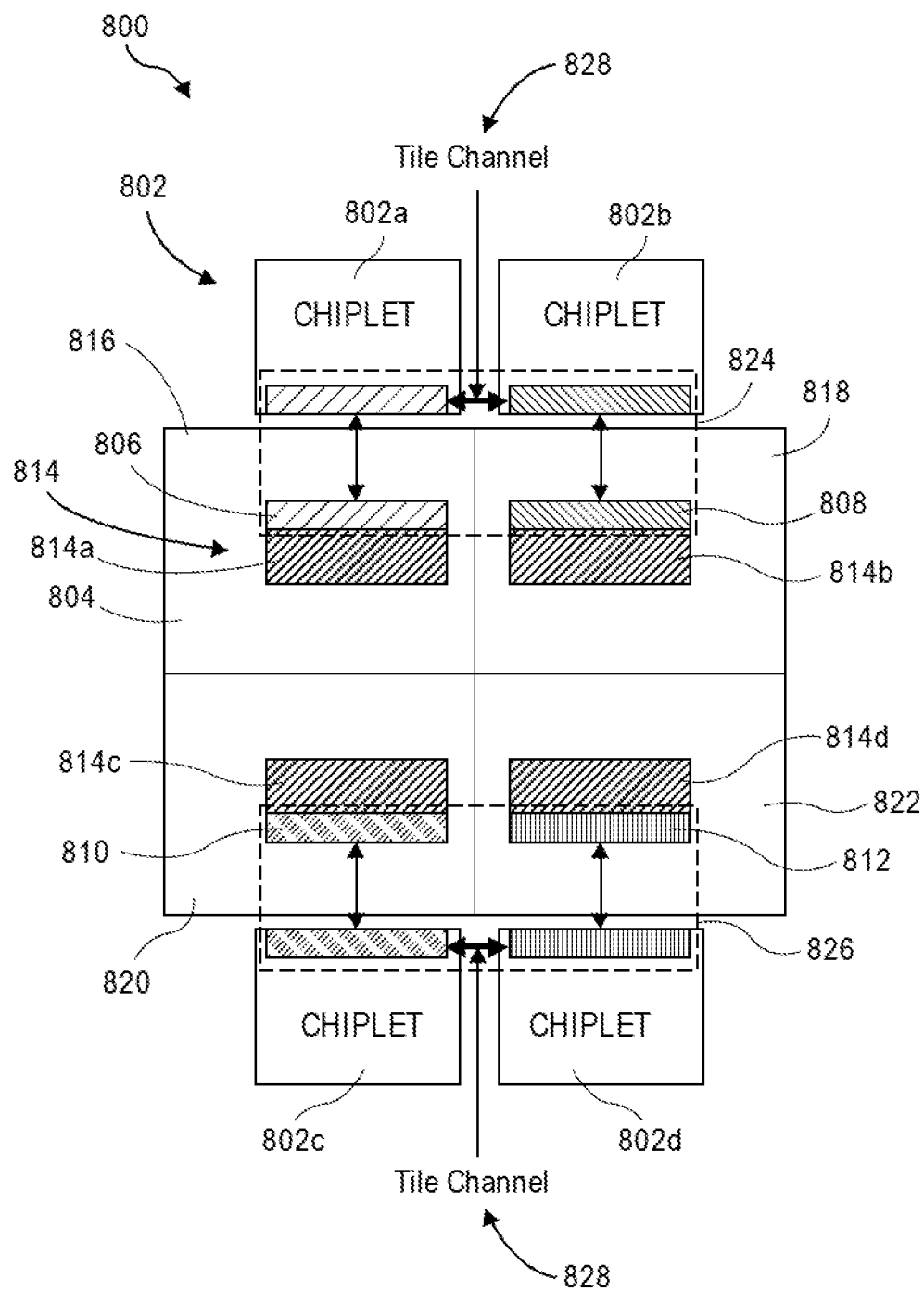
FIG. 8 illustrates a representation of another example semiconductor package arrangement, according to various embodiments.

FIG. 8 illustrates a representation 800 of another example semiconductor package arrangement, according to various embodiments. In particular, the representation 800 illustrates coupling among chiplets 802 and a memory device 804 in some embodiments. The chiplets 802 include one or more of the features of the chiplets 104 (FIG. 1) and/or the chiplets 306 (FIG. 3). Further, the memory device 804 includes one or more of the features of the memory device 106 (FIG. 1) and/or the memory device 308 (FIG. 3). The chiplets 802 and the memory device 804 may be implemented within a semiconductor package, such as the semiconductor package 100 (FIG. 1) and/or the semiconductor package 300 (FIG. 3).

In the illustrated embodiment, the memory device 804 includes four channel clusters: first channel cluster 806, second channel cluster 808, third channel cluster 810, and fourth channel cluster 812. Each of the channel clusters includes one or more memory channels of the memory device 804. In some embodiments, the memory device 804 may include eight memory channels, where each of the channel clusters includes two memory channels. In other embodiments, there may be more or fewer channel clusters, more or fewer memory channels, different allocations of memory channels among the channel clusters, or some combination thereof.

Further, the memory device 804 includes distributed PHY I/Os 814. In particular, the memory device 804 includes a first PHY I/O 814a, a second PHY I/O 814b, a third PHY I/O 814c, and a fourth PHY I/O 814d. The PHY I/O of the memory device 804 is separated into I/O quadrants, where a first I/O quadrant 816 includes the first PHY I/O 814a, a second I/O quadrant 818 includes the second PHY I/O 814b, a third I/O quadrant 820 includes the third PHY I/O 814c, and a fourth I/O quadrant 822 includes the fourth PHY I/O 814d. Each of the PHY I/Os 814 have different channel clusters. For example, the first PHY I/O 814a has the first channel cluster 806, the second PHY I/O 814b has the second channel cluster 808, the third PHY I/O 814c has the third channel cluster 810, and the fourth PHY I/O 814d has the fourth channel cluster 812.

The chiplets 802 include a first chiplet 802a, a second chiplet 802b, a third chiplet 802c, and a fourth chiplet 802d. The chiplets 802 may be included in a single die complex, may be included in separate die complexes, may not be included in a die complex, or some combination thereof. Each of the chiplets 802 are coupled to different ones of the channel clusters. For example, the first chiplet 802a is coupled to the first channel cluster 806, the second chiplet 802b is coupled to the second channel cluster 808, the third chiplet 802c is coupled to the third channel cluster 810, and the fourth chiplet 802d is coupled to the fourth channel cluster 812. Each of the chiplets 802 can utilize the respective channel cluster to store data in and retrieve data from the memory device 804.

The first chiplet 802a and the second chiplet 802b are coupled to each other. The first chiplet 802a and the second chiplet 802b can communicate with each other, including clock distribution communications, register control communications, interface testing function communications, or some combination thereof. Further, the third chiplet 802c and the fourth chiplet 802d are coupled to each other. The third chiplet 802c and the fourth chiplet 802d can communicate with each other, including clock distribution communications, register control communications, interface testing function communications, or some combination thereof.

The representation 800 further includes an interconnect structure that provides the coupling among the first chiplet 802a, the second chiplet 802b, the third chiplet 802c, the fourth chiplet 802d, and the memory device 804. In particular, the interconnect structure is illustrated as a first EMIB 824 and a second EMIB 826 in the illustrated embodiments. The first EMIB 824 and the second EMIB 826 include one or more of the features of the first EMIB 108a (FIG. 1), the second EMIB 108b (FIG. 1), the third EMIB 108c (FIG. 1), and/or the fourth EMIB 108d (FIG. 1). The first EMIB 824 can provide the coupling between the first chiplet 802a and the memory device 804, the second chiplet 802b and the memory device 804, the first chiplet 802a and the second chiplet 802b, or some combination thereof. The second EMIB 826 can provide the coupling between the third chiplet 802c and the memory device 804, the fourth chiplet 802d and the memory device 804, the third chiplet 802c and the fourth chiplet 802d, or some combination thereof. In other embodiments, the interconnect structure may be implemented as one or more EMIBs (such as the first EMIB 108a, the second EMIB 108b, the third EMIB 108c, and/or the fourth EMIB 108d (FIG. 1)), an interposer (such as the interposer described in relation to FIG. 3 and FIG. 4), fan out wafer level structures, or some combination thereof. One or more tile channels 828 may further be coupled to the first chiplet 802a, the second chiplet 802b, the third chiplet 802c, and the fourth chiplet 802d in embodiments where the first chiplet 802a, the second chiplet 802b, the third chiplet 802c, and the fourth chiplet 802d are tiled. In other embodiments, the tile channels 828 may be omitted.

Figure 9:
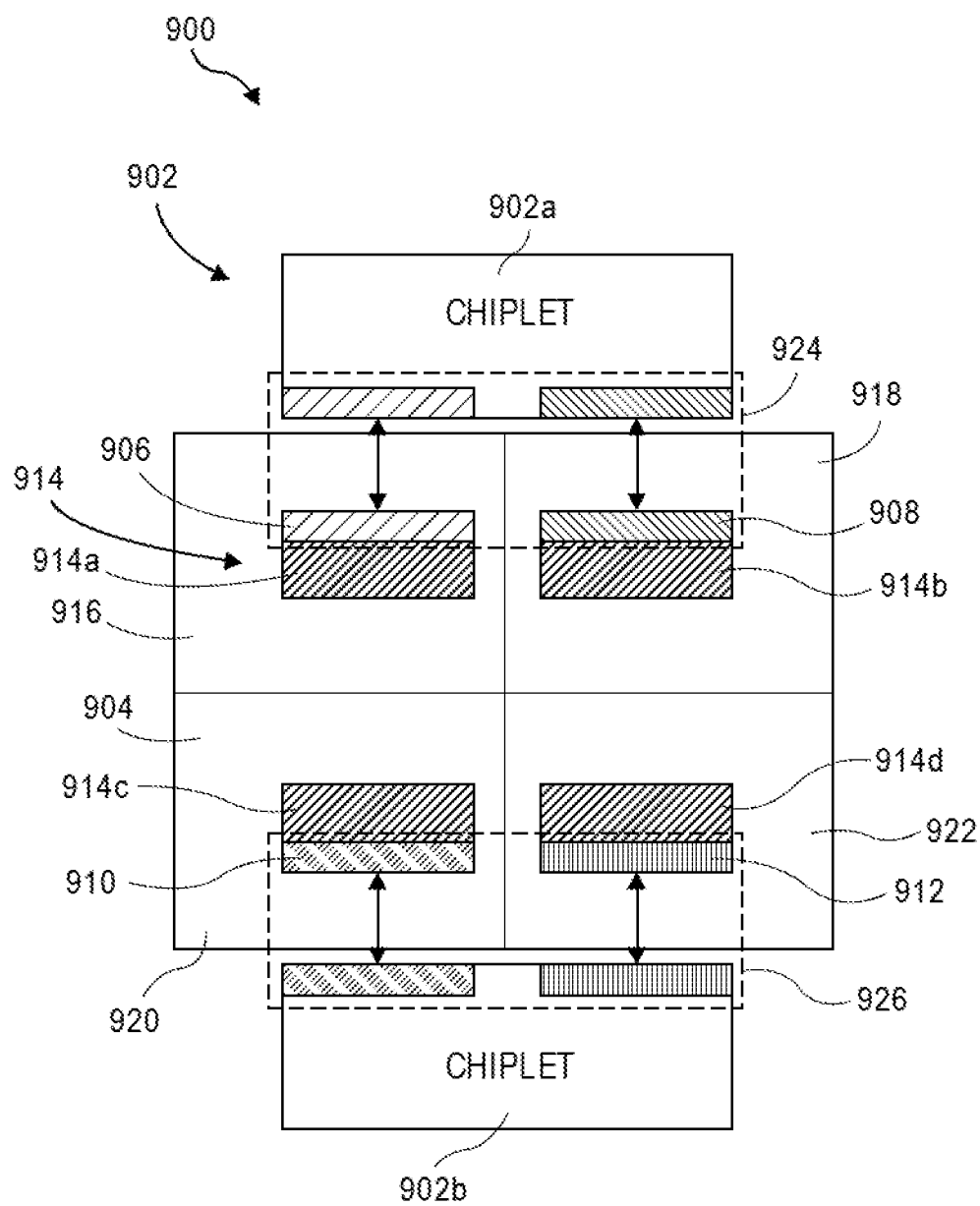
FIG. 9 illustrates a representation of another example semiconductor package arrangement, according to various embodiments.

FIG. 9 illustrates a representation 900 of another example semiconductor package arrangement, according to various embodiments. In particular, the representation 900 illustrates coupling among chiplets 902 and a memory device 904 in some embodiments. The chiplets 902 include one or more of the features of the chiplets 104 (FIG. 1) and/or the chiplets 306 (FIG. 3). Further, the memory device 904 includes one or more of the features of the memory device 106 (FIG. 1) and/or the memory device 308 (FIG. 3). The chiplets 902 and the memory device 904 may be implemented within a semiconductor package, such as the semiconductor package 100 (FIG. 1) and/or the semiconductor package 300 (FIG. 3).

In the illustrated embodiment, the memory device 904 includes four channel clusters: first channel cluster 906, second channel cluster 908, third channel cluster 910, and fourth channel cluster 912. Each of the channel clusters includes one or more memory channels of the memory device 904. In some embodiments, the memory device 904 may include eight memory channels, where each of the channel clusters includes two memory channels. In other embodiments, there may be more or fewer channel clusters, more or fewer memory channels, different allocations of memory channels among the channel clusters, or some combination thereof.

Further, the memory device 904 includes distributed PHY I/Os 914. In particular, the memory device 904 includes a first PHY I/O 914a, a second PHY I/O 914b, a third PHY I/O 914c, and a fourth PHY I/O 914d. The PHY I/O of the memory device 904 is separated into I/O quadrants, where a first I/O quadrant 916 includes the first PHY I/O 914a, a second I/O quadrant 918 includes the second PHY I/O 914b, a third I/O quadrant 920 includes the third PHY I/O 914c, and a fourth I/O quadrant 922 includes the fourth PHY I/O 914d. Each of the PHY I/Os 914 have different channel clusters. For example, the first PHY I/O 914a has the first channel cluster 906, the second PHY I/O 914b has the second channel cluster 908, the third PHY I/O 914c has the third channel cluster 910, and the fourth PHY I/O 914d has the fourth channel cluster 912.

The chiplets 902 include a first chiplet 902a and a second chiplet 902b. The chiplets 902 may be included in a single die complex, may be included in separate die complexes, may not be included in a die complex, or some combination thereof. Each of the chiplets 902 are coupled to different ones of the channel clusters. For example, the first chiplet 902a is coupled to the first channel cluster 906 and the second channel cluster 908, and the second chiplet 902b is coupled to the third channel cluster 910 and the fourth channel cluster 912. Each of the chiplets 902 can utilize the respective channel cluster to store data in and retrieve data from the memory device 904.

The representation 900 further includes an interconnect structure that provides the coupling among the first chiplet 902a, the second chiplet 902b, and the memory device 904. In particular, the interconnect structure is illustrated as a first EMIB 924 and a second EMIB 926 in the illustrated embodiments. The first EMIB 924 and the second EMIB 926 include one or more of the features of the first EMIB 108a (FIG. 1), the second EMIB 108b (FIG. 1), the third EMIB 108c (FIG. 1), and/or the fourth EMIB 108d (FIG. 1). The first EMIB 924 can provide the coupling between the first chiplet 902a and the memory device 904. The second EMIB 926 can provide the coupling between the second chiplet 902b and the memory device 904. In other embodiments, the interconnect structure may be implemented as one or more EMIBs (such as the first EMIB 108a, the second EMIB 108b, the third EMIB 108c, and/or the fourth EMIB 108d (FIG. 1)), an interposer (such as the interposer described in relation to FIG. 3 and FIG. 4), fan out wafer level structures, or some combination thereof.

Figure 10:
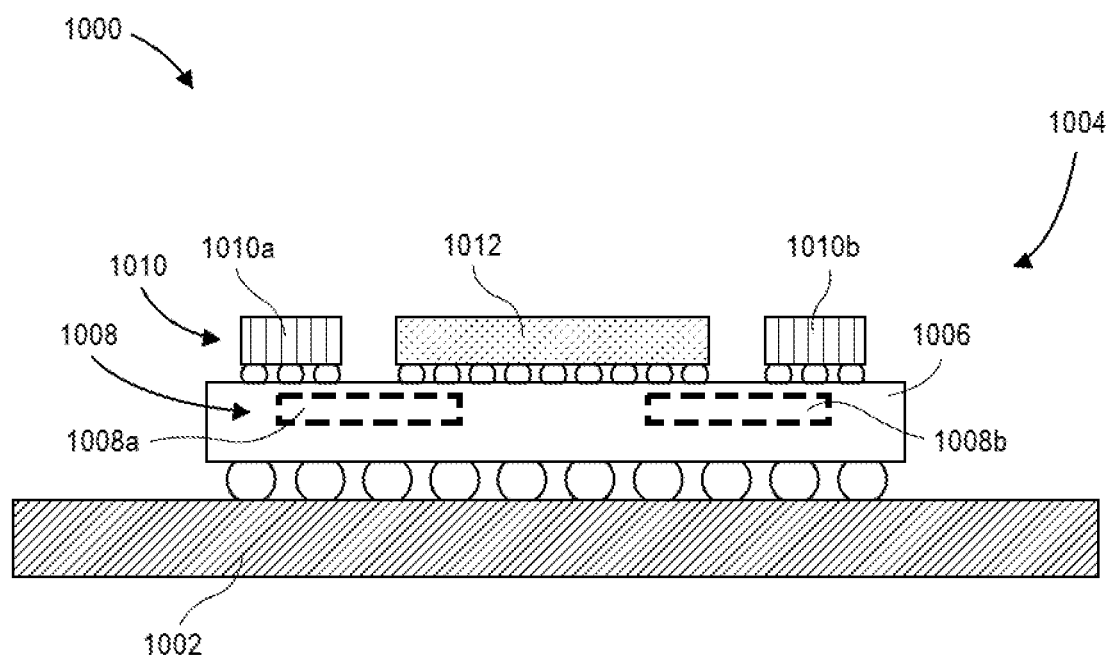
FIG. 10 illustrates a portion of an example computer device, according to various embodiments.

FIG. 10 illustrates a portion of an example computer device 1000, according to various embodiments. The computer device 1000 includes a printed circuit board (PCB) 1002.

The computer device 1000 includes a semiconductor package 1004. The semiconductor package 1004 is mounted to a surface of the PCB 1002. The semiconductor package 1004 may implement one or more of the features the semiconductor packages (such as the semiconductor package 100 (FIG. 1) and/or the semiconductor package 300 (FIG. 3)) and/or the representations of semiconductor package arrangements (such as the representation 500 (FIG. 5), the representation 600 (FIG. 6), the representation 700 (FIG. 7), the representation 800 (FIG. 8), and/or the representation 900 (FIG. 9)), as described herein.

The semiconductor package 1004 includes a substrate assembly 1006. The substrate assembly 1006 includes one or more of the features of the substrate assembly 102 (FIG. 1) and/or the substrate assembly 302 (FIG. 3). The substrate assembly 1006 is mounted and coupled to the PCB 1002.

The semiconductor package 1004 further includes an interconnect structure 1008. In the illustrated embodiment, the interconnect structure 1008 is illustrated as a first EMIB 1008a and a second EMIB 1008b embedded within the substrate assembly 1006. The first EMIB 1008a and the second EMIB 1008b include one or more of the features of the first EMIB 108a (FIG. 1), the second EMIB 108b (FIG. 1), the third EMIB 108c (FIG. 1), and/or the fourth EMIB 108d (FIG. 1). In other embodiments, the interconnect structure 1008 may be one or more EMIBs (such as the first EMIB 108a, the second EMIB 108b, the third EMIB 108c, and/or the fourth EMIB 108d (FIG. 1)), a interposer (such as the interposer described in relation to FIG. 3 and FIG. 4) mounted on the substrate assembly 1006, fan out wafer level structures, or some combination thereof.

The semiconductor package 1004 further includes a plurality of chiplets 1010. In particular, the semiconductor package 1004 includes a first chiplet 1010a and a second chiplet 1010b in the illustrated embodiment. The chiplets 1010 include one or more of the features of the chiplets 104 (FIG. 1), the chiplets 306 (FIG. 3), the chiplets 502 (FIG. 5), the chiplets 602 (FIG. 6), the chiplets 702 (FIG. 7), the chiplets 802 (FIG. 8), and/or the chiplets 902 (FIG. 9). The chiplets 1010 are coupled to the interconnect structure 1008. In embodiments where the interconnect structure 1008 includes EMIBs (as shown), the chiplets 1010 may be mounted on the substrate assembly 1006. In embodiments where the interconnect structure 1008 includes an interposer, the chiplets 1010 may be mounted on the interposer (as shown in FIG. 3 and FIG. 4).

The semiconductor package 1004 further includes a memory device 1012. The memory device 1012 includes one or more of the features of the memory device 106 (FIG. 1), the memory device 308 (FIG. 3), the memory device 504 (FIG. 5), the memory device 604 (FIG. 6), the memory device 704 (FIG. 7), the memory device 804 (FIG. 8), and/or the memory device 904 (FIG. 9). The memory device 1012 is coupled to the interconnect structure 1008. In embodiments where the interconnect structure 1008 includes EMIBs (as shown), the memory device 1012 may be mounted on the substrate assembly 1006. In embodiments where the interconnect structure 1008 includes an interposer, the memory device 1012 may be mounted on the interposer (as shown in FIG. 3 and FIG. 4).

The interconnect structure 1008 provides the coupling among the chiplets 1010 and the memory device 1012 according to the couplings among the chiplets and the memory devices described throughout this disclosure. For example, the interconnect structure 1008 may couple the chiplets 1010 with the memory device 1012, the chiplets 1010 with each other, the substrate assembly 1006 with the chiplets 1010 and the memory device 1012, or some combination thereof.

Figure 11:
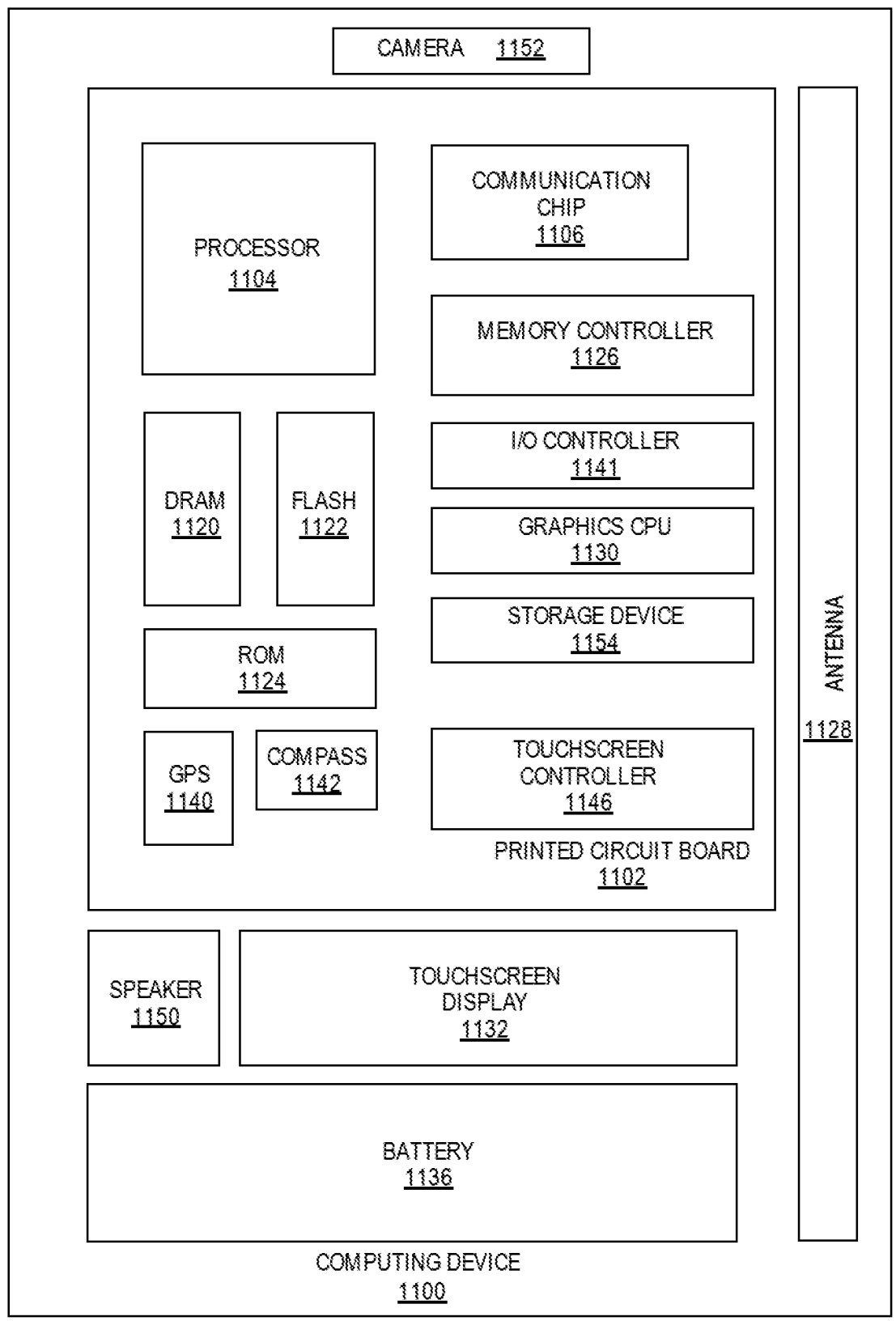
FIG. 11 illustrates an example computer device that may employ the apparatuses and/or methods described herein, in accordance with various embodiments.

FIG. 11 illustrates an example computer device 1100 that may employ the apparatuses and/or methods described herein (e.g., the semiconductor package 100, the semiconductor package 300, the semiconductor package represented by the representation 500 (FIG. 5), the semiconductor package represented by the representation 600 (FIG. 6), the semiconductor package represented by the representation 700 (FIG. 7), the semiconductor package represented by the representation 800 (FIG. 8), the semiconductor package represented by the representation 900 (FIG. 9), and/or the computer device 1000 (FIG. 10)), in accordance with various embodiments. As shown, computer device 1100 may include a number of components, such as one or more processor(s) 1104 (one shown) and at least one communication chip 1106. In various embodiments, the one or more processor(s) 1104 each may include one or more processor cores. In various embodiments, the at least one communication chip 1106 may be physically and electrically coupled to the one or more processor(s) 1104. In further implementations, the communication chip 1106 may be part of the one or more processor(s) 1104. In various embodiments, computer device 1100 may include printed circuit board (PCB) 1102. For these embodiments, the one or more processor(s) 1104 and communication chip 1106 may be disposed thereon. In alternate embodiments, the various components may be coupled without the employment of PCB 1102.

Depending on its applications, computer device 1100 may include other components that may or may not be physically and electrically coupled to the PCB 1102. These other components include, but are not limited to, memory controller 1126, volatile memory (e.g., dynamic random access memory (DRAM) 1120), non-volatile memory such as read only memory (ROM) 1124, flash memory 1122, storage device 1154 (e.g., a hard-disk drive (HDD)), an I/O controller 1141, a digital signal processor (not shown), a crypto processor (not shown), a graphics processor 1130, one or more antenna 1128, a display (not shown), a touch screen display 1132, a touch screen controller 1146, a battery 1136, an audio codec (not shown), a video codec (not shown), a global positioning system (GPS) device 1140, a compass 1142, an accelerometer (not shown), a gyroscope (not shown), a speaker 1150, a camera 1152, and a mass storage device (such as hard disk drive, a solid state drive, compact disk (CD), digital versatile disk (DVD)) (not shown), and so forth.

In some embodiments, the one or more processor(s) 1104, flash memory 1122, and/or storage device 1154 may include associated firmware (not shown) storing programming instructions configured to enable computer device 1100, in response to execution of the programming instructions by one or more processor(s) 1104, to practice all or selected aspects of the methods described herein. In various embodiments, these aspects may additionally or alternatively be implemented using hardware separate from the one or more processor(s) 1104, flash memory 1122, or storage device 1154.

In various embodiments, one or more components of the computer device 1100 may implement the features of the semiconductor packages (such as the semiconductor package 100, the semiconductor package 300, the semiconductor package represented by the representation 500 (FIG. 5), the semiconductor package represented by the representation 600 (FIG. 6), the semiconductor package represented by the representation 700 (FIG. 7), the semiconductor package represented by the representation 800 (FIG. 8), and/or the semiconductor package represented by the representation 900 (FIG. 9)) described herein. For example, the processor 1104, the communication chip 1106, the memory controller 1126, the I/O controller 1141, the graphics CPU 1130, the touch screen controller 1146, the GPS 1140, the compass 1142, or some combination thereof, may implement the features of the semiconductor packages.

The communication chips 1106 may enable wired and/or wireless communications for the transfer of data to and from the computer device 1100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1106 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 1100 may include a plurality of communication chips 1106. For instance, a first communication chip 1106 may be dedicated to shorter range wireless communications such as Wi-Fi and Bluetooth, and a second communication chip 1106 may be dedicated to longer range wireless communications such as GPS, EDGE, GPRS, CDMA, WiMAX, LTE, Ev-DO, and others.

In various implementations, the computer device 1100 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 1100 may be any other electronic device that processes data.

Example 1 may include a semiconductor package, comprising a first chiplet, a second chiplet, a memory device, and an interconnect structure that couples the first chiplet to a first memory channel of the memory device and the second chiplet to a second memory channel of the memory device.

Example 2 may include the semiconductor package of example 1 or any other example herein, further including a substrate assembly, wherein the interconnect structure comprises an interposer located on the substrate assembly, and wherein the first chiplet, the second chiplet, and the memory device are mounted to the interposer on an opposite side of the interposer from the substrate assembly.

Example 3 may include the semiconductor package of example 1 or any other example herein, further including a substrate assembly, wherein the interconnect structure comprises an embedded multi-die interconnect bridge (EMIB) that is embedded with the substrate assembly, and wherein the first chiplet, the second chiplet, and the memory device are coupled to the EMIB.

Example 4 may include the semiconductor package of example 1 or any other example herein, further comprising a substrate assembly, wherein the interconnect structure including a first EMIB that is embedded within the substrate assembly, wherein the first EMIB couples the first chiplet to the first memory channel, and a second EMIB that is embedded within the substrate assembly, wherein the second EMIB couples the second chiplet to the second memory channel.

Example 5 may include the semiconductor package of example 1 or any other example herein, wherein the interconnect structure further couples a physical layer (PHY) of the first chiplet to a PHY of the second chiplet.

Example 6 may include the semiconductor package of example 1 or any other example herein, wherein the interconnect structure further couples a memory controller of the first chiplet to a memory controller of the second chiplet.

Example 7 may include the semiconductor package of example 1 or any other example herein, wherein the memory device includes eight memory channels, wherein the eight memory channels are broken up into a plurality of channel clusters, wherein the first chiplet is coupled to a first channel cluster of the plurality of channel clusters and the first channel cluster includes the first memory channel, and wherein the second chiplet is coupled to a second channel cluster of the plurality of channel clusters and the second channel cluster includes the second memory channel.

Example 8 may include the semiconductor package of example 7 or any other example herein, wherein the first channel cluster includes four memory channels and the second channel cluster includes four different memory channels.

Example 9 may include the semiconductor package of example 1 or any other example herein, wherein the interconnect structure is a first interconnect structure, and wherein the semiconductor package further includes a third chiplet, a fourth chiplet, and a second interconnect structure that couples the third chiplet to a third memory channel of the memory device and the fourth chiplet to a fourth memory channel of the memory device.

Example 10 may include the semiconductor package of example 1 or any other example herein, wherein the memory device comprises a high performance, high bandwidth memory device.

Example 11 may include the semiconductor package of example 1 or any other example herein, wherein the memory device comprises a high bandwidth memory dynamic random-access memory device.

Example 12 may include a computer device, including a printed circuit board (PCB), a semiconductor package mounted to the PCB, including a first chiplet, a second chiplet, a memory device that includes a plurality of memory channels separated into channel clusters, each of the channel clusters including at least one memory channel of the plurality of memory channels, and an interconnect structure that couples the first chiplet to a first channel cluster of the channel clusters and the second chiplet to a second channel cluster of the channel clusters, the memory device to store data for the first chiplet and the second chiplet.

Example 13 may include the computer device of example 12 or any other example herein, wherein the semiconductor package further comprises a substrate assembly, and wherein the interconnect structure comprises an interposer located on the substrate assembly.

Example 14 may include the computer device of example 12 or any other example herein, wherein the semiconductor package further includes a substrate assembly, and wherein the interconnect structure includes an embedded multi-die interconnect bridge (EMIB) that is embedded within the substrate assembly.

Example 15 may include the computer device of example 14 or any other example herein, wherein the EMIB is a first EMIB, and wherein the semiconductor package further includes a third chiplet, a fourth chiplet, and a second EMIB that is embedded within the substrate assembly, wherein the second EMIB couples the third chiplet and the fourth chiplet to the memory device.

Example 16 may include the computer device of example 14 or any other example herein, wherein the EMIB is a first EMIB, wherein the interconnect structure further includes a second EMIB that is embedded within the substrate assembly, wherein an input/output (I/O) physical layer (PHY) of the memory device is separated into I/O quadrants, wherein the first EMIB couples the first chiplet to a first I/O quadrant of the I/O quadrants, and wherein the second EMIB couples the second chiplet to a second I/O quadrant of the I/O quadrants.

Example 17 may include the computer device of example 12 or any other example herein, wherein the interconnect structure is a first interconnect structure, and wherein the semiconductor package further includes a third chiplet, a fourth chiplet, and a second interconnect structure that couples the third chiplet to a third channel cluster of the channel clusters and the fourth chiplet to a fourth channel cluster of the channel clusters.

Example 18 may include the computer device of example 17 or any other example herein, wherein each of the channel clusters includes two memory channels.

Example 19 may include the computer device of example 12 or any other example herein, wherein the memory device comprises a high bandwidth memory (HBM) device.

Example 20 may include the computer device of example 12 or any other example herein, wherein the memory device comprises a high bandwidth memory (HBM) dynamic random-access memory device.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A semiconductor package, comprising:
   a first chiplet comprising a first memory controller;
   a second chiplet comprising a second memory controller, the second memory controller coupled directly to the first memory controller;
   a memory device;
   a substrate assembly; and
   an interconnect structure that couples the first chiplet to a first memory channel of the memory device and the second chiplet to a second memory channel of the memory device, wherein the interconnect structure comprises:
   a first EMIB that is embedded within the substrate assembly, wherein the first EMIB couples the first chiplet to the first memory channel; and
   a second EMIB that is embedded within the substrate assembly, wherein the second EMIB couples the second chiplet to the second memory channel.

2. The semiconductor package of claim 1, wherein the interconnect structure comprises an interposer located on the substrate assembly, and wherein the first chiplet, the second chiplet, and the memory device are mounted to the interposer on an opposite side of the interposer from the substrate assembly.

3. The semiconductor package of claim 1, wherein the interconnect structure comprises an embedded multi-die interconnect bridge (EMIB) that is embedded with the substrate assembly, and wherein the first chiplet, the second chiplet, and the memory device are coupled to the EMIB.

4. The semiconductor package of claim 1, wherein the interconnect structure further couples a physical layer (PHY) of the first chiplet to a PHY of the second chiplet.

5. The semiconductor package of claim 1, wherein the interconnect structure couples the first memory controller of the first chiplet directly to the second memory controller of the second chiplet.

6. The semiconductor package of claim 1, wherein the memory device includes eight memory channels, wherein the eight memory channels are broken up into a plurality of channel clusters, wherein the first chiplet is coupled to a first channel cluster of the plurality of channel clusters and the first channel cluster includes the first memory channel, and wherein the second chiplet is coupled to a second channel cluster of the plurality of channel clusters and the second channel cluster includes the second memory channel.

7. The semiconductor package of claim 6, wherein the first channel cluster includes four memory channels and the second channel cluster includes four different memory channels.

8. The semiconductor package of claim 1, wherein the interconnect structure is a first interconnect structure, and wherein the semiconductor package further comprises:
   a third chiplet;
   a fourth chiplet; and
   a second interconnect structure that couples the third chiplet to a third memory channel of the memory device and the fourth chiplet to a fourth memory channel of the memory device.

9. The semiconductor package of claim 1, wherein the memory device comprises a high performance, high bandwidth memory device.

10. The semiconductor package of claim 1, wherein the memory device comprises a high bandwidth memory dynamic random-access memory device.

11. A computer device, comprising:
    a printed circuit board (PCB);
    a semiconductor package mounted to the PCB, including:
       a first chiplet comprising a first memory controller;
       a second chiplet comprising a second memory controller, the second memory controller coupled directly to the first memory controller;

a memory device that includes a plurality of memory channels separated into channel clusters, each of the channel clusters including at least one memory channel of the plurality of memory channels; and an interconnect structure that couples the first chiplet to a first channel cluster of the channel clusters and the second chiplet to a second channel cluster of the channel clusters, the memory device to store data for the first chiplet and the second chiplet.

12. The computer device of claim 11, wherein the semiconductor package further comprises a substrate assembly, and wherein the interconnect structure comprises an interposer located on the substrate assembly.

13. The computer device of claim 11, wherein the semiconductor package further comprises a substrate assembly, and wherein the interconnect structure includes an embedded multi-die interconnect bridge (EMIB) that is embedded within the substrate assembly.

14. The computer device of claim 13, wherein the EMIB is a first EMIB, and wherein the semiconductor package further comprises:
a third chiplet;
a fourth chiplet; and
a second EMIB that is embedded within the substrate assembly, wherein the second EMIB couples the third chiplet and the fourth chiplet to the memory device.

15. The computer device of claim 13, wherein the EMIB is a first EMIB, wherein the interconnect structure further includes a second EMIB that is embedded within the substrate assembly, wherein an input/output (I/O) physical layer (PHY) of the memory device is separated into I/O quadrants, wherein the first EMIB couples the first chiplet to a first I/O quadrant of the I/O quadrants, and wherein the second EMIB couples the second chiplet to a second I/O quadrant of the I/O quadrants.

16. The computer device of claim 11, wherein the interconnect structure is a first interconnect structure, and wherein the semiconductor package further includes:
a third chiplet;
a fourth chiplet; and
a second interconnect structure that couples the third chiplet to a third channel cluster of the channel clusters and the fourth chiplet to a fourth channel cluster of the channel clusters.

17. The computer device of claim 16, wherein each of the channel clusters includes two memory channels.

18. The computer device of claim 11, wherein the memory device comprises a high bandwidth memory (HBM) device.

19. The computer device of claim 11, wherein the memory device comprises a high bandwidth memory (HBM) dynamic random-access memory device.

20. A semiconductor package, comprising:
a first chiplet;
a second chiplet;
a third chiplet;
a fourth chiplet;
a memory device;
a first interconnect structure that couples the first chiplet to a first memory channel of the memory device and the second chiplet to a second memory channel of the memory device; and a second interconnect structure that couples the third chiplet to a third memory channel of the memory device and the fourth chiplet to a fourth memory channel of the memory device.

21. A semiconductor package, comprising:
a first chiplet comprising a first memory controller;
a second chiplet comprising a second memory controller, the second memory controller coupled directly to the first memory controller;
a memory device; and
an interconnect structure that couples the first chiplet to a first memory channel of the memory device and the second chiplet to a second memory channel of the memory device, wherein the interconnect structure further couples a physical layer (PHY) of the first chiplet to a PHY of the second chiplet.

22. A semiconductor package, comprising:
a first chiplet comprising a first memory controller;
a second chiplet comprising a second memory controller, the second memory controller coupled directly to the first memory controller;
a memory device;
a first interconnect structure that couples the first chiplet to a first memory channel of the memory device and the second chiplet to a second memory channel of the memory device;
a third chiplet;
a fourth chiplet; and
a second interconnect structure that couples the third chiplet to a third memory channel of the memory device and the fourth chiplet to a fourth memory channel of the memory device.

23. A semiconductor package, comprising:
a first chiplet comprising a first memory controller;
a second chiplet comprising a second memory controller, the second memory controller coupled directly to the first memory controller;
a memory device;
a substrate assembly; and
an interconnect structure that couples the first chiplet to a first memory channel of the memory device and the second chiplet to a second memory channel of the memory device, wherein the interconnect structure comprises an embedded multi-die interconnect bridge (EMIB) that is embedded with the substrate assembly, and wherein the first chiplet, the second chiplet, and the memory device are coupled to the EMIB.

24. A semiconductor package, comprising:
a first chiplet comprising a first memory controller;
a second chiplet comprising a second memory controller, the second memory controller coupled directly to the first memory controller;
a memory device; and
an interconnect structure that couples the first chiplet to a first memory channel of the memory device and the second chiplet to a second memory channel of the memory device, wherein the interconnect structure couples the first memory controller of the first chiplet directly to the second memory controller of the second chiplet.

* * * * *